(12) United States Patent
Augustyn et al.

(10) Patent No.: US 8,259,962 B2
(45) Date of Patent: Sep. 4, 2012

(54) AUDIO SYSTEM CONFIGURED TO FADE AUDIO OUTPUTS AND METHOD THEREOF

(75) Inventors: Michael Thomas Augustyn, Kokomo, IN (US); Kavya H. Narayan, Bangalore (IN)

(73) Assignee: Delphi Technologies, Inc., Troy, MI (US)

( * ) Notice: Subject to any disclaimer, the term of this patent is extended or adjusted under 35 U.S.C. 154(b) by 199 days.

(21) Appl. No.: 12/709,722

(22) Filed: Feb. 22, 2010

(65) Prior Publication Data

US 2011/0206224 A1 Aug. 25, 2011

(51) Int. Cl.
*H03G 3/00* (2006.01)
(52) U.S. Cl. .......................................... 381/104; 381/86
(58) Field of Classification Search .................. 381/302, 381/86, 365, 150, 300, 103–107, 1, 56–59, 381/96, 182, 17, 18; 700/94
See application file for complete search history.

(56) References Cited

U.S. PATENT DOCUMENTS

| 5,129,004 A * | 7/1992 | Imai et al. ........................ 381/86 |
| 5,384,855 A * | 1/1995 | Kwang ........................... 381/100 |
| 5,617,480 A * | 4/1997 | Ballard et al. .................. 381/98 |
| 7,386,139 B2 * | 6/2008 | Hashimoto et al. ........... 381/310 |
| 2002/0181718 A1 * | 12/2002 | Kato et al. ....................... 381/86 |

* cited by examiner

*Primary Examiner* — Xu Mei
*Assistant Examiner* — Lun-See Lao
(74) *Attorney, Agent, or Firm* — Paul W. Thiede

(57) ABSTRACT

An audio system configured to fade audio outputs and method thereof are provided, wherein the audio system includes a first speaker, a second speaker, a low-frequency output speaker, wherein the low-frequency output speaker is proximate the at least one second speaker, and a receiver configured to alter a signal communicated to the first speaker, the second speaker, and the low-frequency output speaker, such that the audio outputs thereof are faded. The audio system further includes a filter in communication between the receiver and the first speaker, wherein the filter is configured to limit a frequency of the signal communicated from the receiver to the first speaker, and a processor configured to alter a frequency limit of the filter, such that a low frequency portion of the signal is received by the first speaker, and a low-frequency output of the first speaker is increased approximately proportionately to the fade of the second speaker, the low-frequency output speaker, or a combination thereof.

8 Claims, 8 Drawing Sheets

AUDIO SYSTEM CONFIGURED TO FADE AUDIO OUTPUTS AND METHOD THEREOF

FIELD OF THE INVENTION

The present invention generally relates to an audio system and method thereof, and more particularly, an audio system configured to fade audio outputs and a method thereof.

BACKGROUND OF THE INVENTION

Generally, in an automotive audio system that utilizes a satellite subwoofer setup, there can be an issue with respect to system fading. Typically, four main channel speakers can be supplied through a high pass filter, which removes low frequency information from the system. In many of these vehicles, the subwoofer speakers are located in the back package shelf of the vehicle so that the volume of the trunk can be used as the enclosure for the subwoofer speaker. This large enclosure can make it easier for the subwoofer speakers to produce low frequency.

SUMMARY OF THE INVENTION

According to one aspect of the present invention, an audio system is provided that includes at least one first speaker configured to emit an audio output, at least one second speaker configured to emit an audio output, and at least one low-frequency output speaker configured to emit an audio output, wherein the at least one low-frequency output speaker is proximate the at least one second speaker. Additionally, the audio system includes a receiver in communication with the at least one first speaker, the at least one second speaker, and the at least one low-frequency output speaker, wherein the receiver is configured to alter a signal communicated to the at least one first speaker, the at least one second speaker, and the at least one low-frequency output speaker, such that the audio outputs thereof are faded, and a filter in communication between the receiver and the at least one first speaker, wherein the filter is configured to limit a frequency of the signal communicated from the receiver to the at least one first speaker. The audio system further includes a processor in communication with the receiver, wherein the processor is configured to alter a frequency limit of the filter, such that a low frequency portion of the signal is received by the at least one first speaker, and a low-frequency output of the at least one first speaker is increased approximately proportionately to the fade of at least one of the at least one second speaker and the at least one low-frequency output speaker.

According to another aspect of the present invention, a method of audio fading in an audio system that includes at least one first speaker, at least one second speaker, and at least one low-frequency output speaker proximate the at least one second speaker is provided. The method includes the steps of communicating a signal to the at least one first speaker, communicating a signal to the at least one second speaker, communicating a signal to the at least one low-frequency output speaker, emitting an audio output from the at least one first speaker, emitting an audio output from the at least one second speaker, and emitting an audio output from the at least one low-frequency output speaker. The method also includes the steps of altering signals communicated to the at least one first speaker, the at least one second speaker, and the at least one low-frequency output speaker, such that audio outputs thereof are faded, and altering a frequency limit of the audio output of the at least one first speaker, such that a low-frequency portion of the signal is received by the at least one first speaker, and a low-frequency output of the at least one first speaker is increased approximately proportionately to the fade of at least one of the at least one second speaker and the at least one low-frequency output speaker.

According to yet another aspect of the present invention, a method of audio fading in an audio system integrated with a vehicle including a vehicle cabin, wherein the audio system includes a receiver in communication with at least one front speaker located in a front portion of the vehicle cabin, at least one rear speaker located in a rear portion of the vehicle cabin, and at least one low-frequency output speaker proximate said at least one rear speaker is provided. The method includes the steps of communicating a signal to the at least one front speaker from the receiver, communicating a signal to the at least one rear speaker from the receiver, communicating a signal to the at least one low-frequency output speaker from the receiver, emitting an audio output from the at least one front speaker, emitting an audio output from the at least one rear speaker, and emitting an audio output from the at least one low-frequency output speaker. The method also includes the steps of altering signals communicated from the receiver to the at least one front speaker, the at least one rear speaker, and the at least one low-frequency output speaker, such that audio outputs thereof are faded, and altering a frequency limit of the audio output of the at least one front speaker, such that a low-frequency portion of the signal is received by the at least one front speaker, and a low-frequency output of the at least one front speaker is increased approximately proportionately to the fade of at least one of the at least one rear speaker and the at least one low-frequency output speaker.

These and other features, advantages, and objects of the present invention will be further understood and appreciated by those skilled in the art by reference to the following specification, claims, and appended drawings.

BRIEF DESCRIPTION OF THE DRAWINGS

The present invention will now be described, by way of example, with reference to the accompanying drawings, in which.

DESCRIPTION OF EMBODIMENTS

Figure 1:
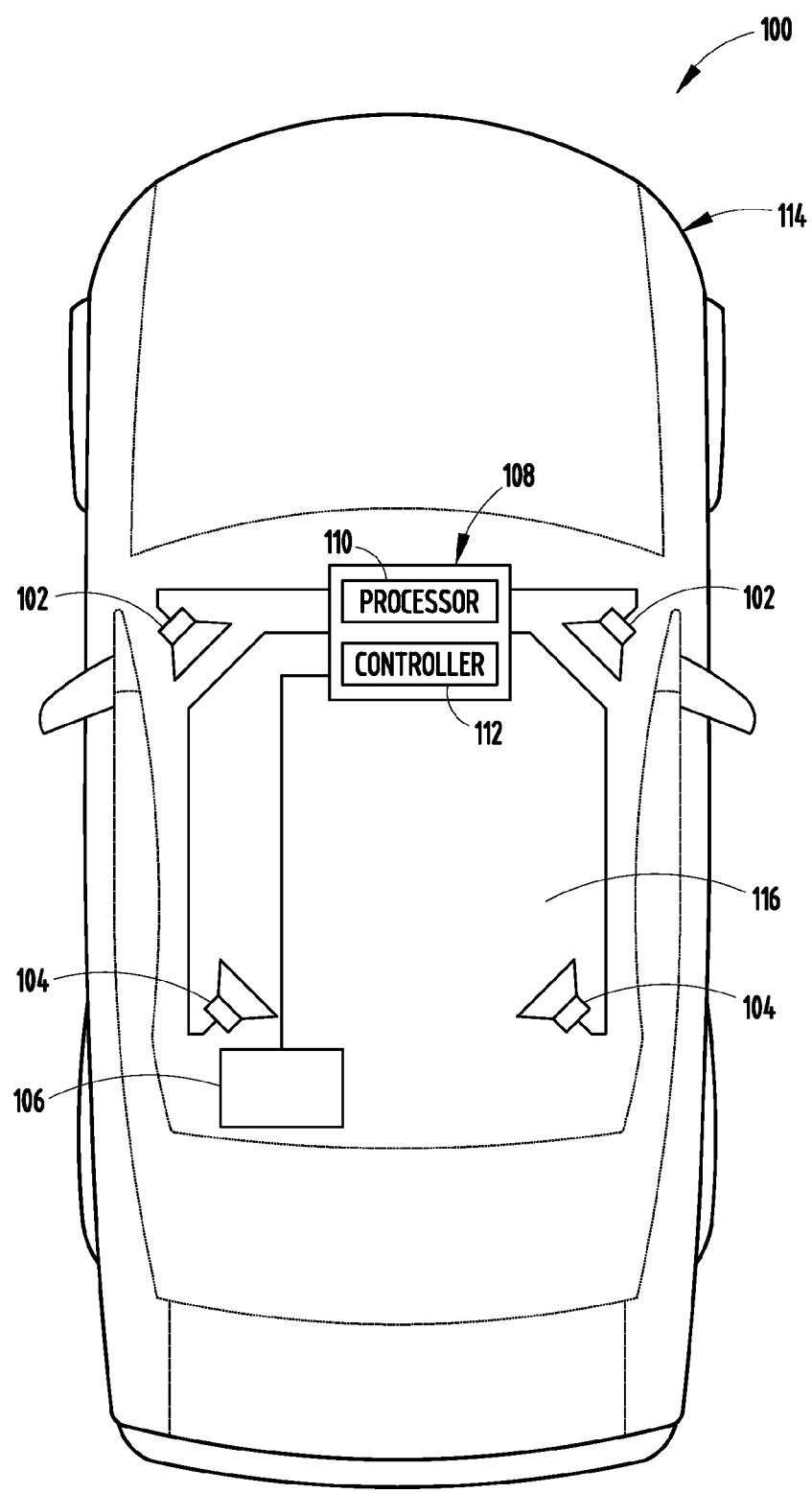
FIG. 1 is an environmental view of an audio system, in accordance with one embodiment of the present invention.
Figure 2:
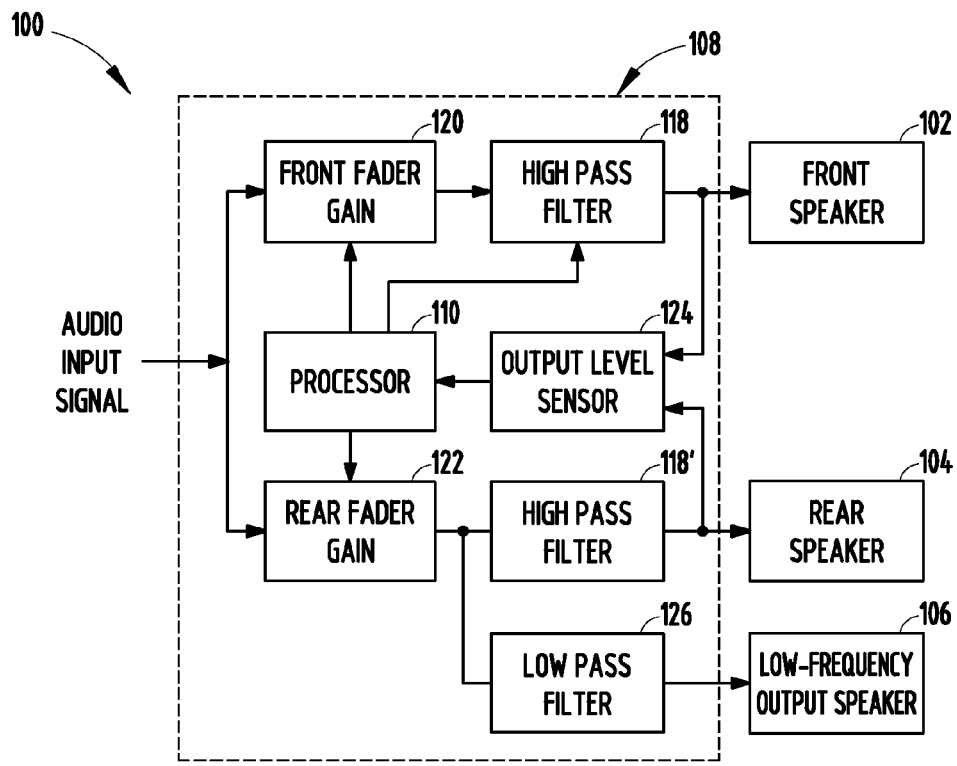
FIG. 2 is a schematic diagram of an audio system, in accordance with one embodiment of the present invention.
Figure 3:
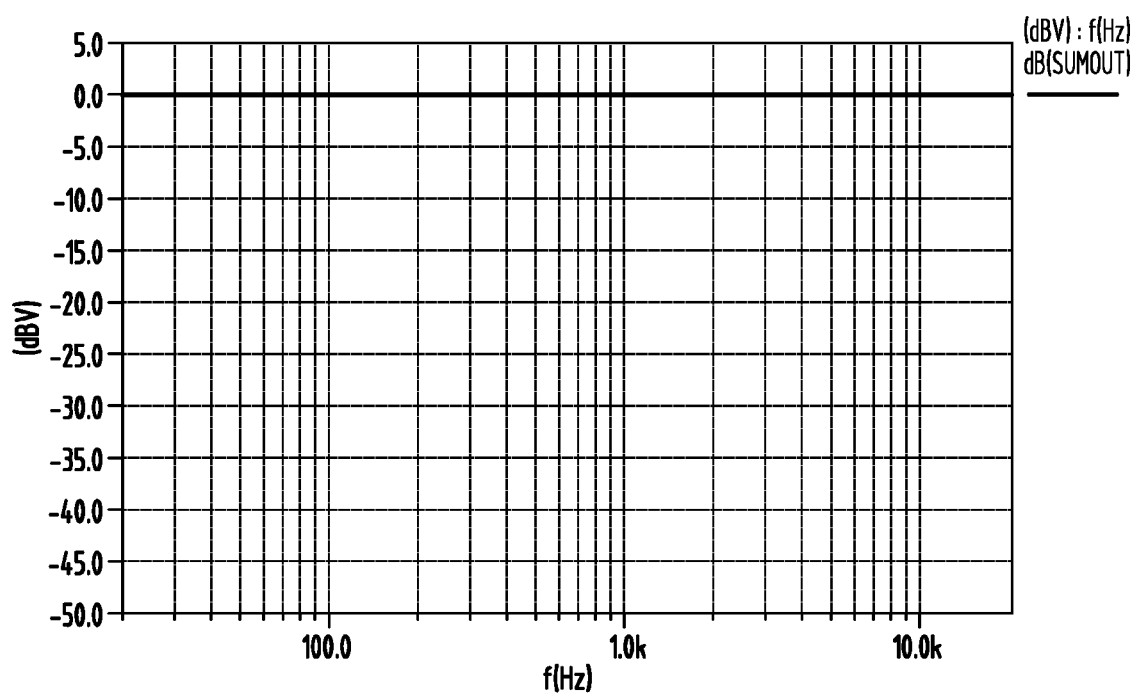
FIG. 3 is a graph illustrating a representation of an audio system response to a front passenger of a vehicle, in accordance with one embodiment of the present invention.
Figure 4A:
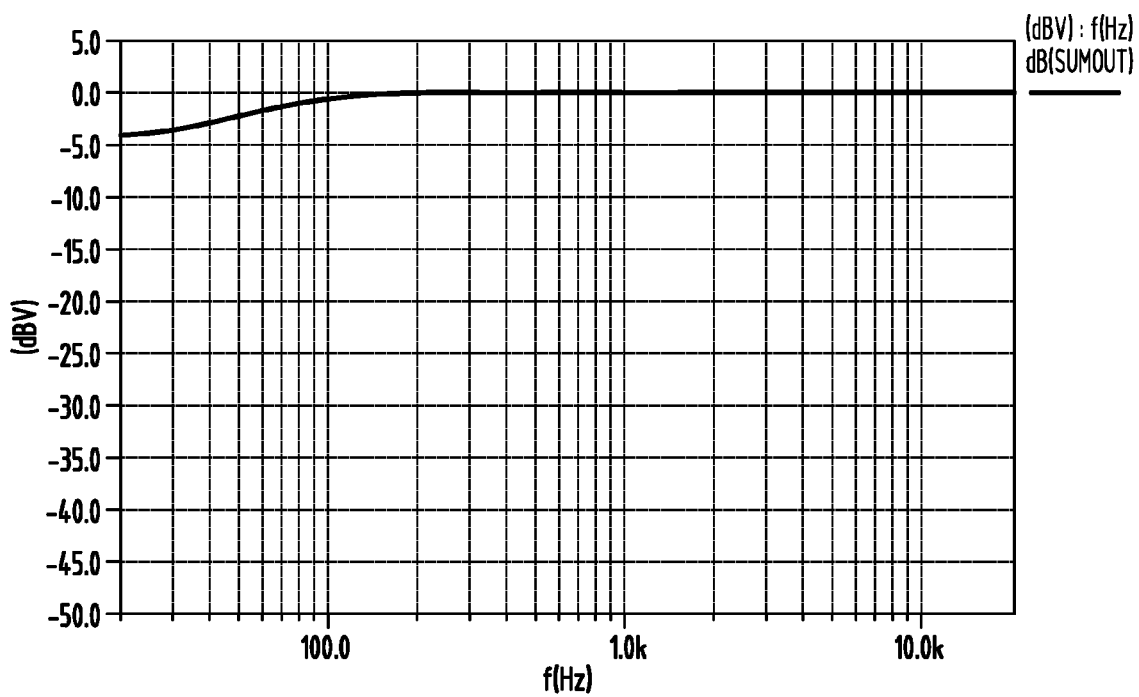
FIG. 4A is a graph illustrating an audio system response to a front occupant of a vehicle after the audio system has been faded five decibels (5 dB) towards a front portion of the vehicle, in accordance with one embodiment of the present invention.
Figure 4B:
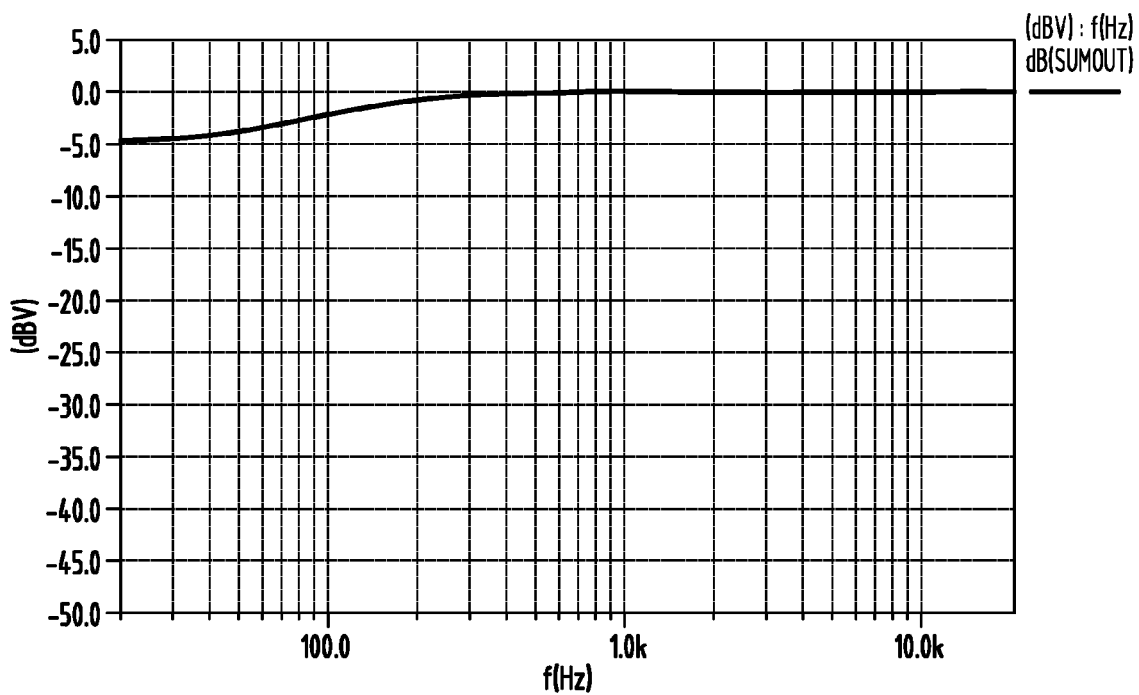
FIG. 4B is a graph illustrating an audio system response to a front occupant of a vehicle after the audio system has been faded five (5) dB towards a front portion of the vehicle.
Figure 5A:
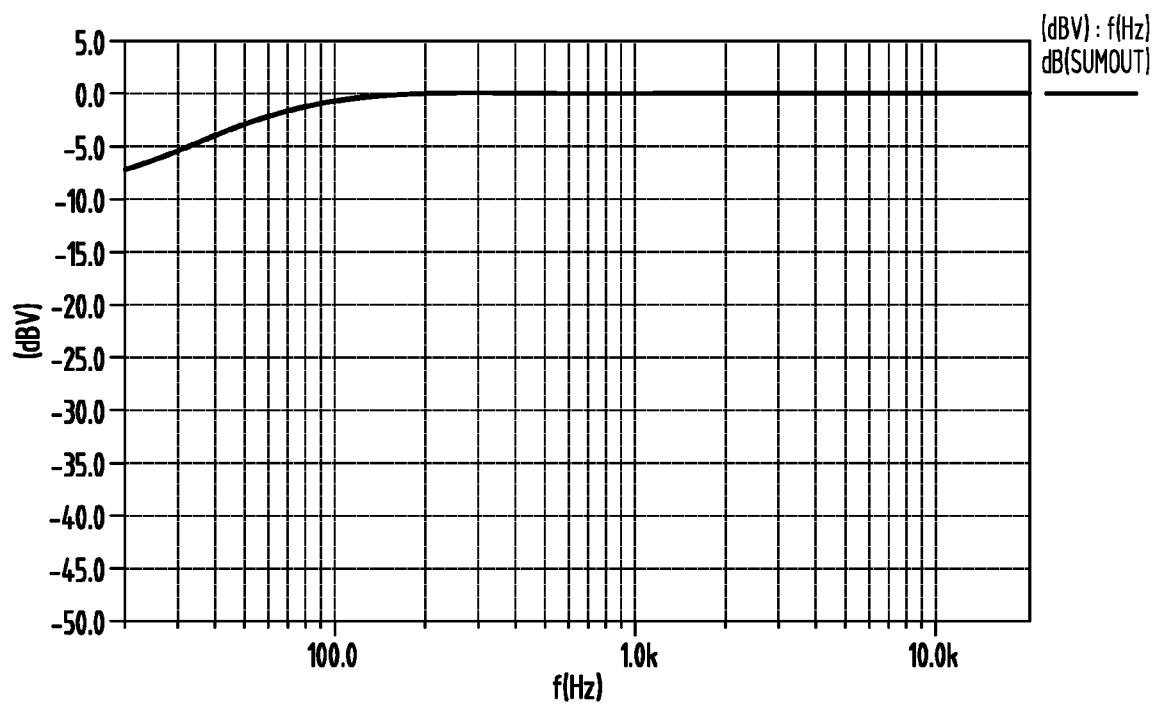
FIG. 5A is a graph illustrating an audio system response to a front occupant of a vehicle after the audio system has been faded ten (10) dB towards a front portion of the vehicle, in accordance with one embodiment of the present invention.
Figure 5B:
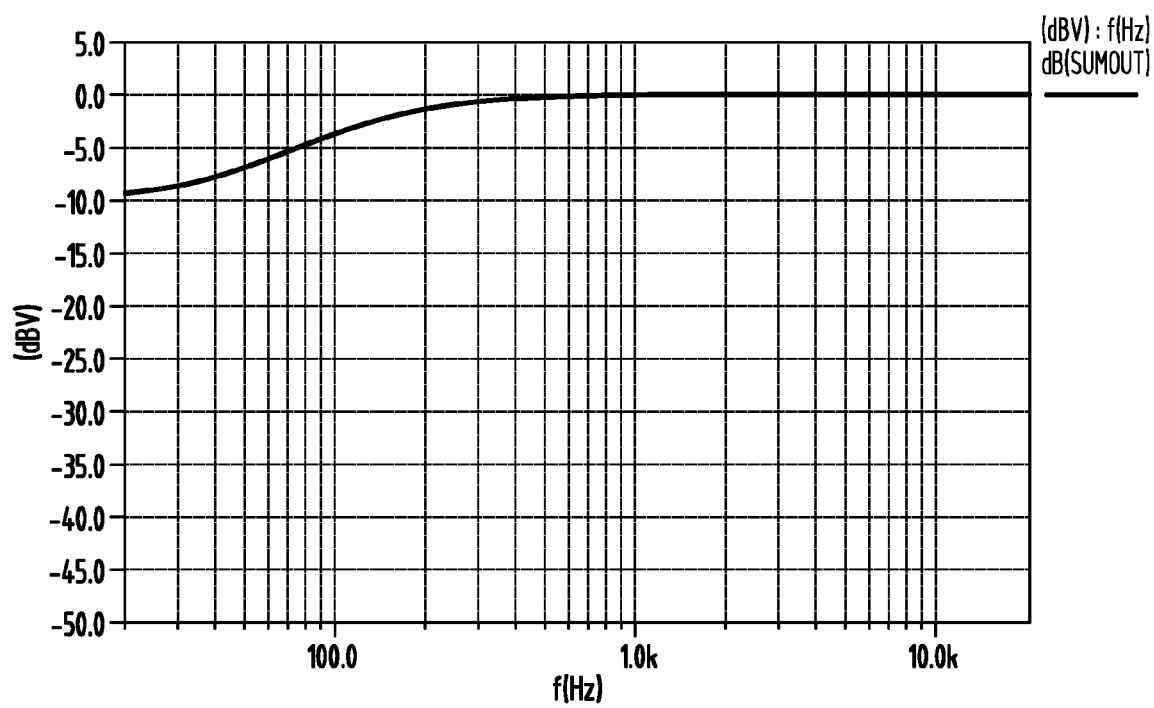
FIG. 5B is a graph illustrating an audio system response to a front occupant of a vehicle after the audio system has been faded ten (10) dB towards a front portion of the vehicle.
Figure 6A:
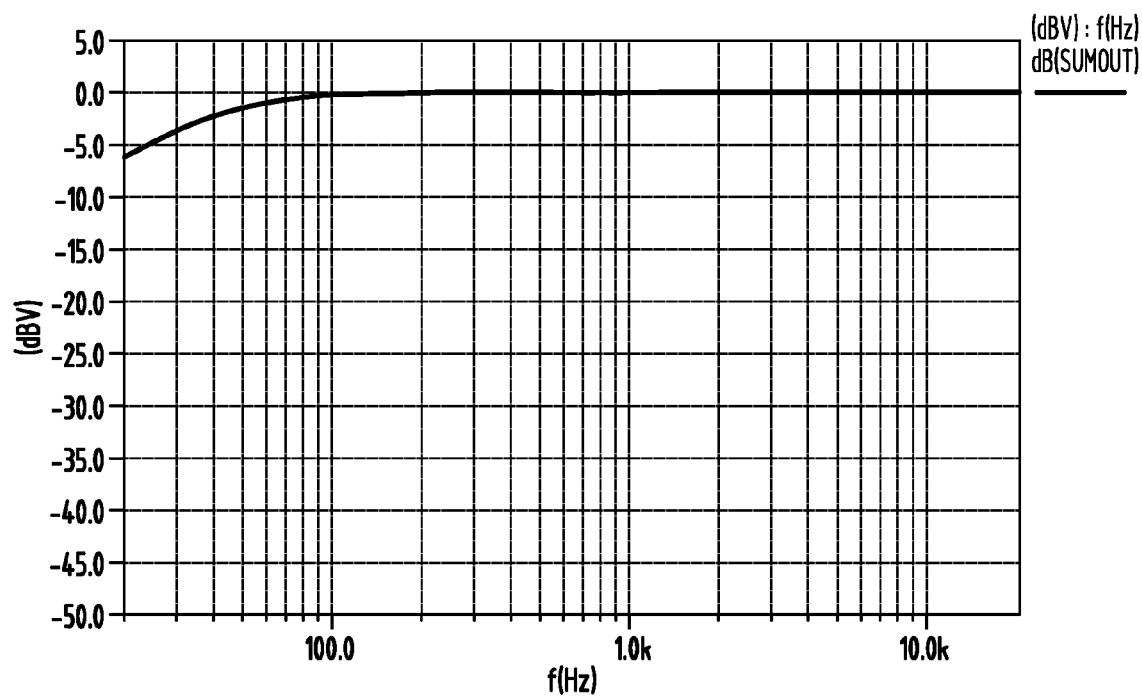
FIG. 6A is a graph illustrating an audio system response to a front occupant of a vehicle after the audio system has been faded twenty (20) dB towards a front portion of the vehicle, in accordance with one embodiment of the present invention.
Figure 6B:
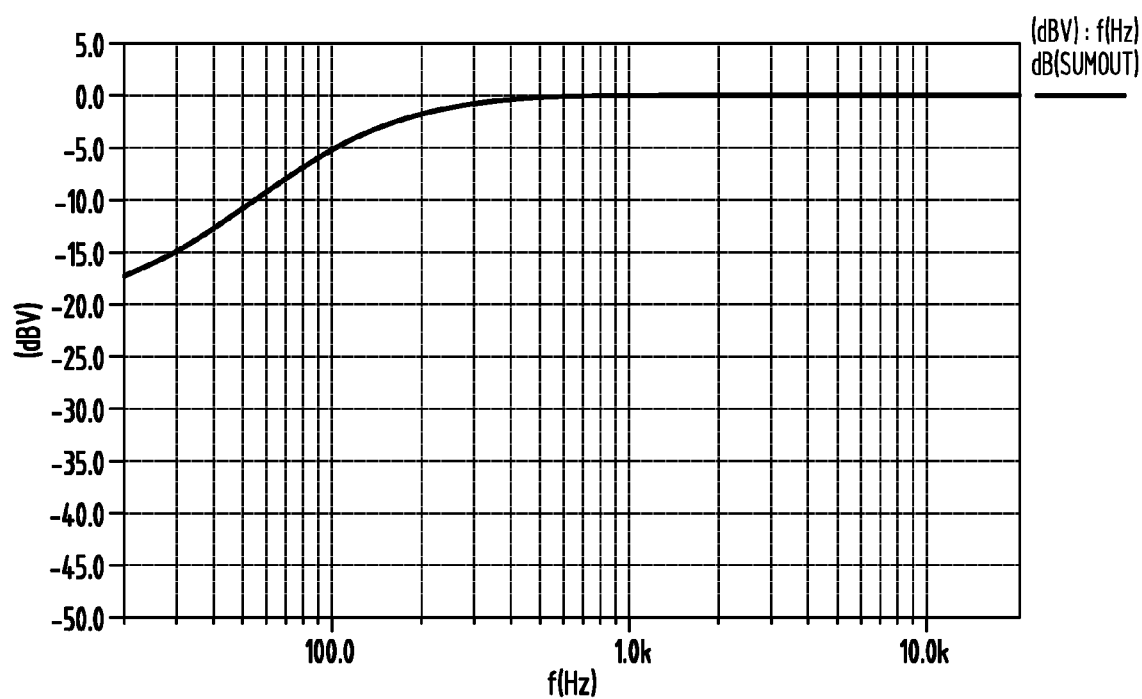
FIG. 6B is a graph illustrating an audio system response to a front occupant of a vehicle after the audio system has been faded twenty (20) dB towards a front portion of the vehicle.
Figure 7A:
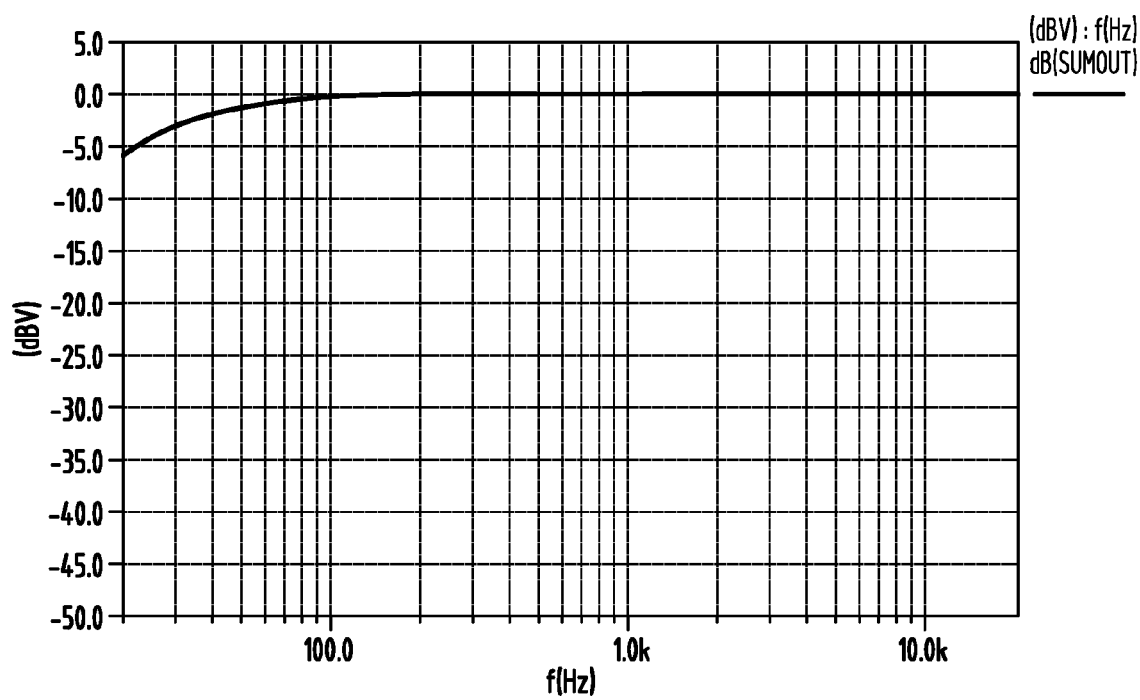
FIG. 7A is a graph illustrating an audio system response to a front occupant of a vehicle after the audio system has been faded thirty (30) dB towards a front portion of the vehicle, in accordance with one embodiment of the present invention.
Figure 7B:
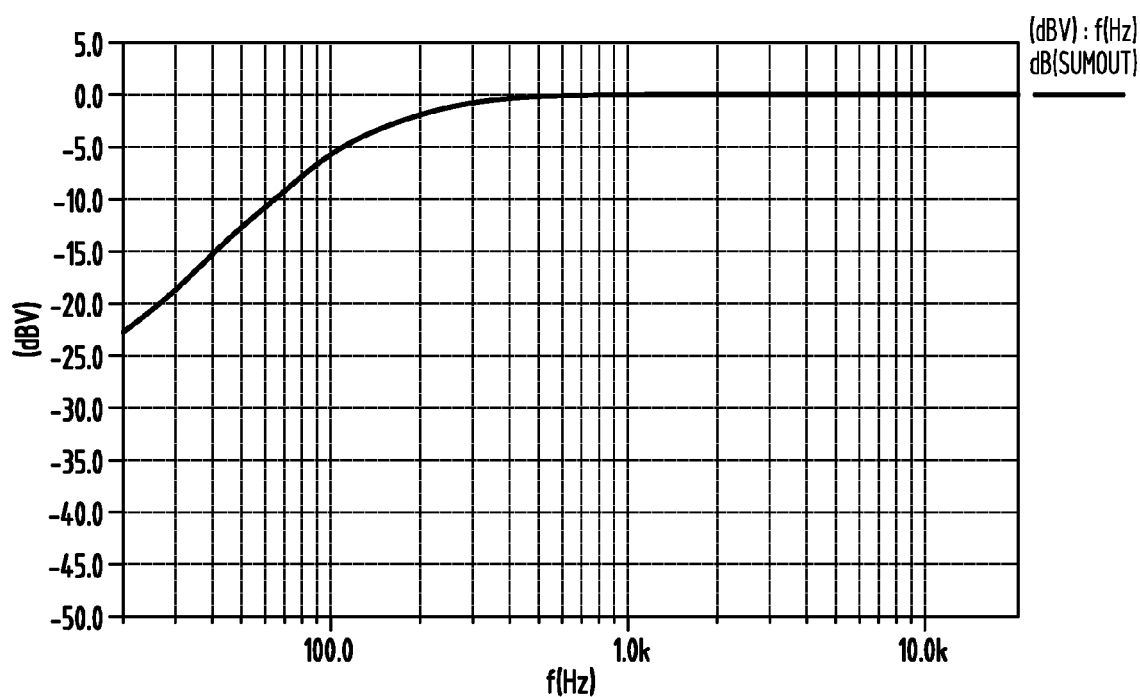
FIG. 7B is a graph illustrating an audio system response to a front occupant of a vehicle after the audio system has been faded thirty (30) dB towards a front portion of the vehicle.
Figure 8A:
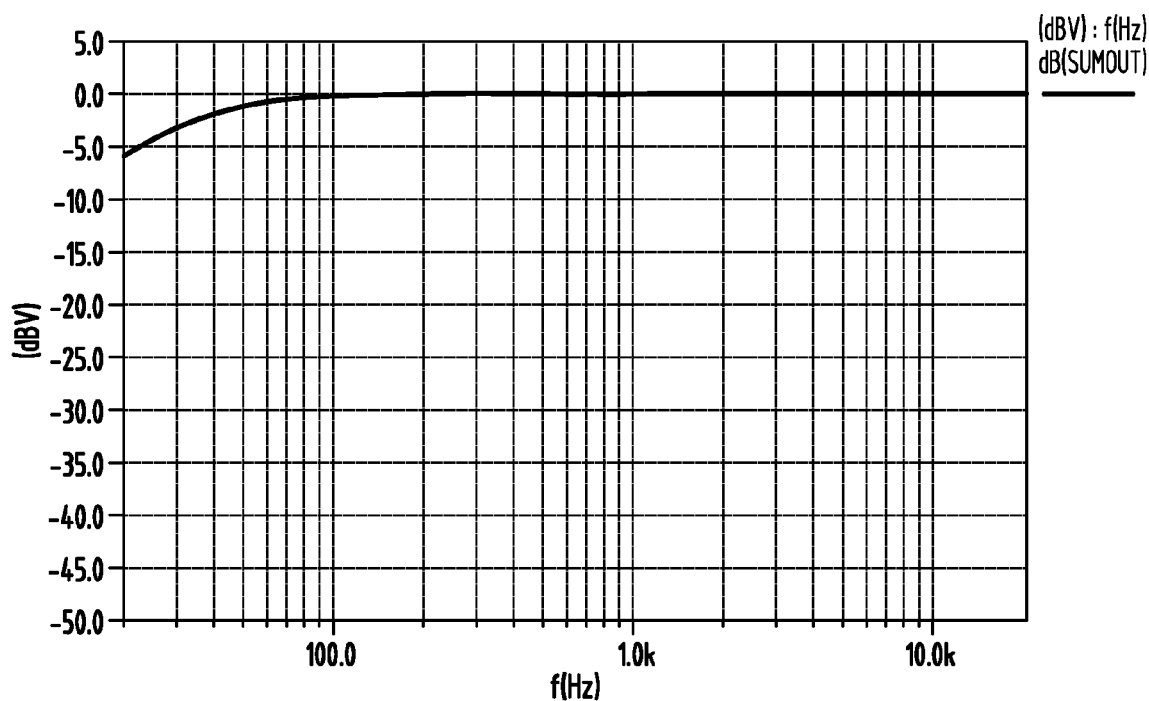
FIG. 8A is a graph illustrating an audio system response to a front occupant of a vehicle after the audio system has been faded forty (40) dB towards a front portion of the vehicle, in accordance with one embodiment of the present invention.
Figure 8B:
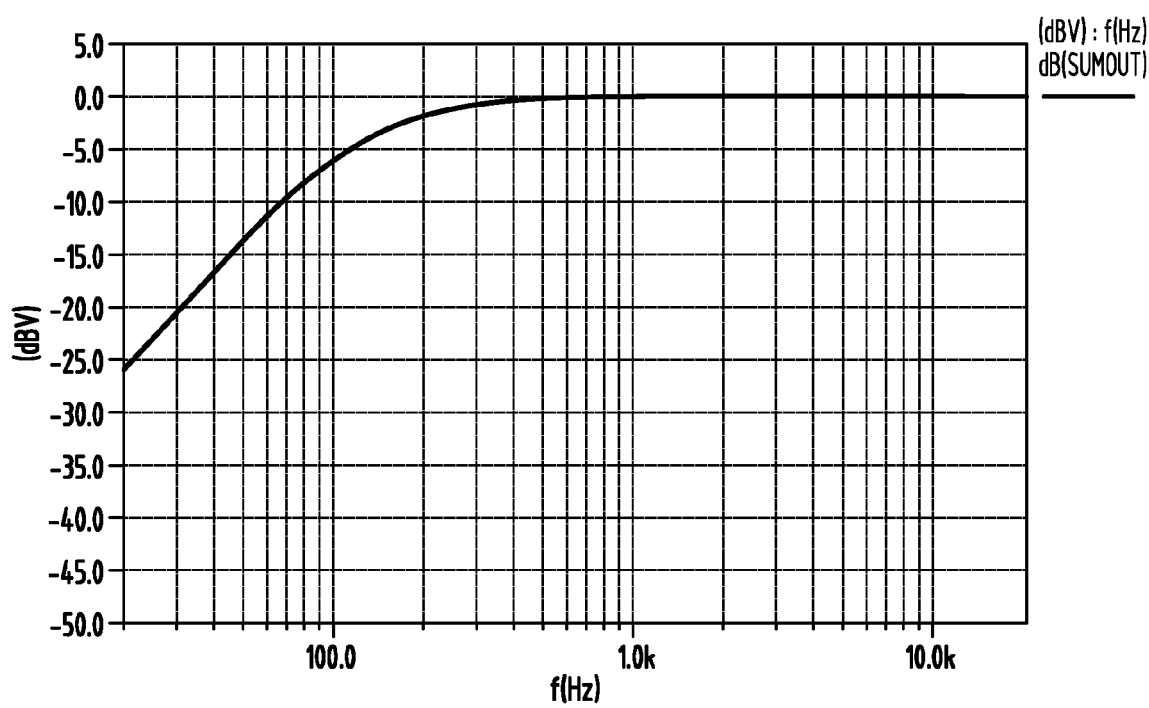
FIG. 8B is a graph illustrating an audio system response to a front occupant of a vehicle after the audio system has been faded forty (40) dB towards a front portion of the vehicle.

In regards to FIGS. 1 and 2, an audio system is generally shown at reference identifier 100. The audio system 100 can include at least one first speaker 102 configured to emit an audio output, at least one second speaker 104 configured to emit an audio output, and at least one low-frequency output speaker 106 configured to emit an audio output, wherein the low-frequency output speaker 106 can be proximate that the second speaker 104. The audio system 100 can further include a receiver, generally indicated at reference identifier 108, in communication with the first speaker 102, the second speaker 104, and the low-frequency output speaker 106. The receiver 108 can be configured to alter a signal communicated to the first speaker 102, the second speaker 104, and the low-frequency output speaker 106, such that audio outputs thereof are faded.

The audio system 100 can also include a filter 118 (FIG. 2) in communication between the receiver 108 and the first speaker 102, wherein the filter 118 can be configured to limit a frequency of the signal communicated from the receiver to the first speaker 102. Additionally, the audio system 100 can include a processor 110 in communication with the receiver 108, wherein the processor 110 is configured to alter a frequency limit (e.g., a cutoff frequency) of the filter 118, such that a low-frequency portion of the signal can be received by the first speaker 102, and a low-frequency output of the first speaker 102 can be increased approximately proportionately to the fade of the second speaker 104, the low-frequency speaker 106, or a combination thereof, as described in greater detail herein.

By way of explanation and not limitation, in an automotive environment, occupants in a back seat area of a vehicle may, at times, desire that no audio be outputted around them in the vehicle. Also, some occupants may desire that all rear speakers (e.g., the second speaker 104) be muted during a full fade to a front area of the vehicle, such as, but not limited to, when children are sleeping in the back seat area of the vehicle. Under these circumstances, when the audio system 100 is not being utilized, all of the low-frequency information below a high pass filter is typically lost from the front speakers, which can compromise audio play back to occupants in the front area of the vehicle. Typically, the low-frequency information or portion of the signal can be communicated to, and utilized by, the low-frequency output speaker 106, which can be, but is not limited to, a subwoofer. The audio system 100, as described herein, can alter a frequency limit of the filter 118, which affects a signal communicated from the receiver 108 to the first speaker 102, the low-frequency output speaker 106, or a combination thereof, to reduce undesirable audio playback as a result of losing low-frequency information.

According to one embodiment, the receiver 108 can include a controller 112 configured to be altered, such that the faded audio outputs of the first speaker 102, the second speaker 104, and the low-frequency output speaker 106 are a function of a position of the controller 112. The processor 110 can be configured to reduce the audio output of the low-frequency output speaker 106 and the frequency limit of the filter 118 as a function of the position of the controller 112. Thus, as the fade or reduction of the audio output of the second speaker 104 is increased, the frequency limit of the filter 118 can be approximately proportionately decreased, such that a low-frequency output of the first speaker 102 can be increased approximately proportionately to the fade of the second speaker 104. It should be appreciated by those skilled in the art that a low-frequency output of the first speaker 102 can be increased approximately proportionately to the fade of the second speaker 104, or a combination of the fade of the second speaker 104 and the low-frequency output speaker 106.

For purposes of explanation and not limitation, the controller 112 can be a turn-dial knob that can be turned or actuated by a user to alter the fade of the speakers 102, 104, 106 of the audio system 100. However, it should be appreciated by those skilled in the art that the controller 112 can be other suitable devices for altering the fade of the speakers 102, 104, 106, such as, but not limited to, a sliding dial, a virtual dial, the like, or a combination thereof.

In such an embodiment, in operation, a user of the audio system 100 can actuate the controller 112 to fade the audio outputs of the speakers 102, 104, 106 towards the first speaker 102 (i.e., the first speaker 102 emits a greater audio output than the second speaker 104 and the low-frequency output speaker 106). The processor 110 can then determine the location of the controller 112 (e.g., monitoring the controller 112 or receiving data relevant to a location and/or movement of the controller 112), and increase a low-frequency output of the first speaker 102 as a function of the fade of the second speaker 104, the fade of the low-frequency output speaker 106, or a combination thereof. Typically, the increase in low-frequency output of the first speaker 102 is based upon the processor 110 reducing a frequency limit of the filter 118, and is approximately proportional to the decrease in audio output of the low-frequency output speaker 106.

According to an alternate embodiment, the processor 110 can be configured to measure the audio outputs from the first speaker 102 and the second speaker 104, and compare the measured audio outputs. The alteration of the frequency limit of the filter 118 can then be reduced as a function of the comparison or difference of the measured audio outputs. Thus, as the fade or reduction of the audio output of the second speaker 104 is increased, the frequency limit of the filter 118 can be approximately proportionately decreased, such that a low-frequency output of the first speaker 102 is increased approximately proportionately to the fade of the second speaker 104. It should be appreciated by those skilled in the art that the audio output of the second speaker 104 can be monitored and compared to the audio output of the first speaker 102, the audio output of the low-frequency output speaker 106 can be monitored and compared to the audio output of the first speaker 102, or a combination of the audio outputs of the second speaker 104 and the low-frequency output speaker 106 can be monitored and compared to the audio output of the first speaker 102. Similar to that as above, the fading of audio outputs of the speakers 102, 104, 106 can be done by actuating the controller 112.

In such an embodiment, in operation, a user of the audio system 100 can actuate the controller 112 to fade the audio outputs of the speakers 102, 104, 106 towards the first speaker 102 (e.g., the first speaker 102 emits a greater audio output than the second speaker 104 and the low-frequency output speaker 106). The processor 110 can then compare the audio output of the first speaker 102 with the audio output of the second speaker 104, the low-frequency output speaker 106, or a combination thereof (e.g., determine a difference in the audio outputs of the speakers 102, 104, 106, respectively), and increase a low-frequency output of the first speaker 102 as a function of the fade of the second speaker 104 and low-frequency output speaker 106. Typically, the increase in low-frequency output of the first speaker 102 is based upon the processor 110 reducing a frequency limit of the filter 118, and is approximately proportional to the decrease in audio output of the second speaker 104.

According to one embodiment, the audio system 100 can be integrated in a vehicle generally indicated at reference identifier 114 (FIG. 1). The vehicle 114 can have a vehicle cabin 116, wherein the first speaker 102 can include a speaker located in a front portion of vehicle cabin 116, and the second speaker 104 can be a rear speaker located in a rear of the vehicle cabin 116. Generally, the first and rear portions can be based upon the vehicle's 114 normal operating position. Typically, the low-frequency output speaker 106 can be proximate the second speaker 104, such that the low-frequency output speaker 106 is positioned closer to the second speaker 104 than the first speaker 102.

The audio system 100 can include an antenna in communication with the receiver 108, wherein the antenna can be configured to receive the signal communicated from a transmitter of a source provider. Additionally or alternatively, an audio input signal can be provided by a compact disc (CD) player, a portable compressed audio player, a front panel jack, a Digital Video Disc (DVD) player, other suitable media devices or multimedia devices, the like, or a combination thereof.

With respect to FIG. 2, the audio system 100 can include the one or more filters 118, wherein at least one filter 118 is a high pass filter 118 in communication between the receiver 108 and the first speaker 102. A second filter 118', such as, but not limited to, a high pass filter can be in communication between the receiver 106 and the second speaker 104. Typically, a high pass filter passes high frequencies, while attenuating frequencies lower than a frequency limit (e.g., a cutoff frequency). According to one embodiment, a low-frequency is a signal having a frequency that is low enough for emitting an audio output by the low-frequency output speaker 106 (e.g., a subwoofer).

The audio system 100 can further include a front fader gain device 120 and a rear fader gain device 122 in communication with the processor 110, such that the front fader gain device 120 and the rear fader gain device 122 receive inputs of an audio input signal (e.g., from the antenna or other devices as exemplary described above) and an output of the processor 110. The audio system 100 can also include an output level sensor 124 in communication with the processor 110, and a low pass filter 126 in communication with the low-frequency output speaker 106. According to one embodiment, the receiver 108 can include the processor 110, the filter 118, 118', the front fader gain device 120, the rear fader gain device 122, the output level sensor 124, the low pass filter 126, additional or alternative electronic hardware and/or software components, the like, or a combination thereof, as exemplary illustrated in FIG. 2 using dashed lines.

According to one embodiment, by altering a signal communicated from the receiver 108 to the low-frequency output speaker 106, such that the audio output thereof is reduced approximately proportionately to a fade of the second speaker 104, the low-frequency output speaker 106 can be reduced while the high pass filter 118 can have a frequency limit that is reduced to allow for a transition of low frequency information to be received by the first speaker 102. Typically, this allows for improved audio performance when the low-frequency output speaker 106 is fully faded to the front of the vehicle 114. This is illustrated in the diagrams of FIGS. 4A, 5A, 6A, 7A, and 8A, which illustrate improved performance when compared to systems that do not include such an audio system 100, as illustrated in FIGS. 4B, 5B, 6B, 7B, and 8B, respectively.

It should be appreciated by those skilled in the art that the at least one first speaker 102, the at least one second speaker 104, and the low-frequency output speaker 106 are illustrated in FIG. 1 as having two speakers, two speakers, and one speaker, respectively, for purposes of explanation and not limitation, and that any number of speakers 102, 104, 106 can be utilized in the audio system 100. It should further be appreciated by those skilled in the art that the increase in low-frequency audio output of the first speaker 102 (e.g., reduction in a frequency limit of the filter 118) can be approximately proportional or un-proportional increase with respect to the fade of the second speaker 104, the low-frequency speaker 106, or a combination thereof.

Additionally or alternatively, an increase in low-frequency audio output of the first speaker 102 can be approximately proportional to the fade of the second speaker 104, the low-frequency speaker 106, or a combination thereof. Typically, the fade of the second speaker 104 is approximately the same as the fade of the low-frequency output speaker 106.

Figure 9:
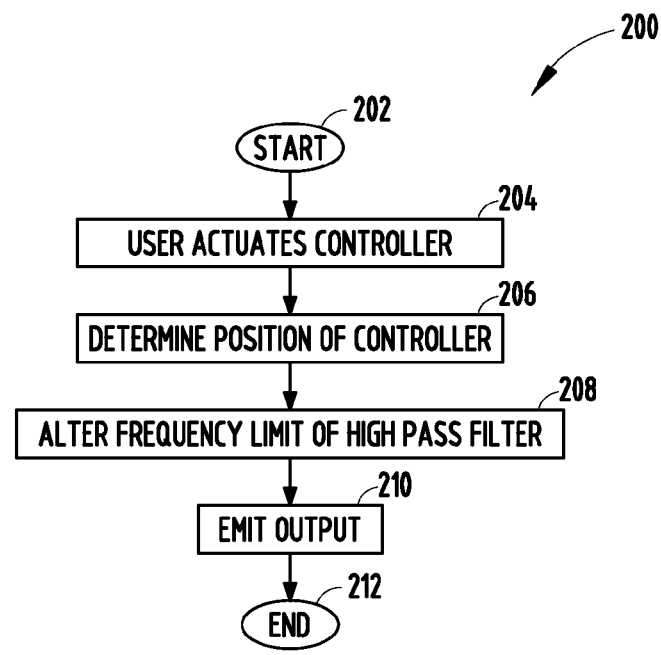
FIG. 9 is a flowchart illustrating a method of audio fading in an audio system, in accordance with one embodiment of the present invention.

With respect to FIGS. 1, 2, and 9, a method of audio fading in an audio system 100 is generally shown in FIG. 9 at reference identifier 200. The method 200 starts at step 202, and proceeds to step 204, wherein a user actuates the controller 112. At step 206, the position of the controller 112 is determined, and at step 208, a frequency limit of the filter 118 is altered. Typically, when the frequency limit of the filter 118 is altered, a low-frequency portion of the signal is received by the first speaker 102, such that the low-frequency portion of the signal is no longer blocked or filtered by the filter 118. The reduction of the frequency limit of the filter 118 can be approximately proportional to the fade of the second speaker 104.

The method 200 can then proceed to step 210, wherein the audio output is emitted. Typically, the audio output is emitted using the first speaker 102, the second speaker 104, the low-frequency output speaker 106, or a combination thereof, such that the faded audio outputs of the first speaker 102, the second speaker 104, and the low-frequency output speaker 106 are a function of a position of the controller 118. The method 200 then ends at step 212.

Figure 10:
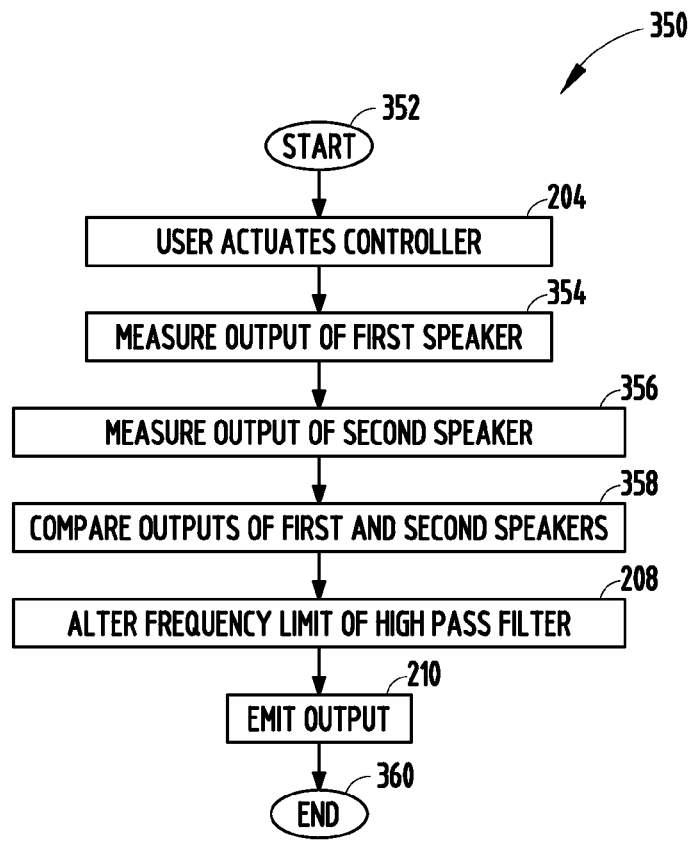
FIG. 10 is a flowchart illustrating a method of audio fading in an audio system, in accordance with one embodiment of the present invention.

As to FIGS. 1, 2, and 10, a method of audio fading an audio system 100 is generally shown in FIG. 10 at reference identifier 350. The method 350 starts at step 352, and proceeds to step 204, wherein the user actuates the controller 112. At step 354, an output from the first speaker 102 is measured, and at step 356, an output from the second speaker 104 is measured.

The method 350 then proceeds to step 358, wherein the outputs from the first speaker 102 and the second speaker 104 are compared. Typically, the measurement comparison of the outputs of the first speaker 102 and second speaker 104 can be used to determine levels between a front channel and a rear channel to measure an amount of fade. It should be appreciated by those skilled in the art that the audio output of the second speaker 104 can be measured and compared to the audio output of the first speaker 102, or a combination of the measured audio outputs of the second speaker 104 and the low-frequency output speaker 106 can be compared to the audio output of the first speaker 102.

At step 208, the frequency limit of the filter 118 can be altered based upon the comparison of step 358. Typically, altering the frequency of the filter 118, at step 208, results in the audio output of the low-frequency output speaker 106 being reduced approximately proportionately to the fade of the second speaker 104, while increasing a low-frequency audio output of the first speaker 102 approximately proportionately to the fade of the second speaker 104. An audio output is emitted at step 210, and the method 350 then ends at step 360. It should be appreciated by those skilled in the art that the references in FIG. 10, and the description thereof, to the front speaker 102 and the rear speaker 104 correspond to the first speaker 102 and second speaker 104, respectively, and are for purposes of explanation and not limitation.

Advantageously, the audio system 100 and methods 200, 350 allow for the low-frequency output to be emitted by the first speaker 102 rather than the low-frequency output speaker 106 when the audio system 100 is configured to be faded towards the front portion of the vehicle 114. It should be appreciated by those skilled in the art that there may be additional or alternative advantages to the audio system 100 and methods 200, 350. Further, it should be appreciated by those skilled in the art that the above-described components and steps can be configured in additional or alternative ways not explicitly described herein.

Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An audio system comprising:
at least one first speaker configured to emit an audio output;
at least one second speaker configured to emit an audio output;
at least one low-frequency output speaker configured to emit an audio output; and
a receiver in electrical communication with said at least one first speaker and said at least one second speaker and said at least one low-frequency output speaker, said receiver being configured to alter a signal communicated to said at least one first speaker and said at least one second speaker and said at least one low-frequency output speaker such that said audio outputs thereof are inversely proportionally faded between the first speaker and one of the second speaker and the low-frequency output speaker, and said receiver includes,
a filter in electrical communication with said at least one first speaker, said filter including a cutoff frequency, and
a processor in electrical communication with said filter and configured to alter the cutoff frequency of said filter,
wherein when said fade occurs so as to decrease at least one of said audio output of said second speaker and said audio output of said low-frequency output speaker the audio output of said first speaker increases as the processor decreases said cutoff frequency of said filter in response to said fade so that a low frequency output of said signal associated with said decreased cutoff frequency is further electrically communicated to ensure said increase in said audio output of said first speaker, and
wherein said receiver further includes,
a high pass filter in direct electrical communication with said second speaker, and
a low pass filter in direct electrical communication with said low-frequency output speaker, and
wherein the filter that is in electrical communication with said at least one speaker is a high pass filter and said receiver further includes,
a front fader gain device receiving an electrical output from the processor and being an electrical input to the high pass filter in electrical communication with the first speaker and configured to receive an audio input signal disposed in the receiver,
a rear fader gain device receiving an electrical output from the processor and being an electrical input to the high pass filter in electrical communication with the second speaker and an electrical input to the low pass filter in electrical communication with said low-frequency output speaker, and
an output level sensor having an electrical output received by the processor and respective electrical inputs received from an electrical output of the high pass filter in electrical communication with the first speaker and an electrical output of the high pass filter in electrical communication with the second speaker.

2. The audio system of claim 1, wherein said receiver further includes,
a controller in electrical communication with said processor,
wherein said fade is a function of said controller being operatively controlled by a user of the audio system.

3. The audio system of claim 1, wherein said processor is further configured to measure said audio outputs of said first speaker and at least one of said second speaker and said low-frequency output speaker and compare said measured audio outputs, and when the audio outputs are measured and compared by said processor, said processor decreases said cutoff frequency of said filter as a function of said comparison of said measured audio outputs.

4. The audio system of claim 1, wherein said at least one first speaker comprises at least one speaker located in a front portion of a vehicle cabin of a vehicle.

5. The audio system of claim 1, wherein said at least one second speaker comprises at least one speaker located in a rear portion of a vehicle cabin of a vehicle, and said at least one low-frequency output speaker is a subwoofer disposed proximate said second speaker in the rear portion of the vehicle cabin.

6. The audio system of claim 1, wherein the audio system is disposed in a vehicle.

7. An audio system comprising:
a receiver; and
at least one first speaker and at least one second speaker and at least one low-frequency output speaker respectively in electrical communication with the receiver and further respectively configured to emit an audio output, the receiver being configured to alter a respective electrical signal communicated to said speakers for fading said audio outputs of the audio system between the first speaker in a manner that is inversely proportional to at least one of said second speaker and said low-frequency output speaker, said receiver including,
- a controller configured to alter said proportional fading based on operative control thereto by a user of the audio system,
- a processor in electrical communication with said controller and configured to electrically operate in response to said altered controller, and
- a filter in respective electrical communication with said processor and said first speaker and including a cutoff frequency, wherein when the user alters the controller the processor responds to the controller and alters the cutoff frequency of the filter so that the audio output of said first speaker adjusts to a level based on said inverse proportional fading, and wherein the receiver further includes,
- an output level sensor is disposed intermediate to, and electrically connected to an output of said respective high pass filters, and an output of the output level sensor is directly electrically connected to the processor, and the controller comprises one of,
- (i) a turn-dial knob,
- (ii) a sliding dial, and
- (iii) a virtual dial, and the filter comprises a high pass filter in direct electrical communication with the first speaker, said first speaker being disposed in a front portion of a vehicle cabin of a vehicle, and the processor has direct electrical communication with the high pass filter associated with the first speaker, and the receiver further includes a high pass filter in direct electrical communication with the second speaker and a low pass filter in direct electrical communication with the low-frequency output speaker, and the low-frequency output speaker comprises a subwoofer disposed proximate the second speaker in a rear portion of the vehicle cabin of the vehicle.

8. The audio system of claim 7, wherein when said audio output of the first speaker increases and the audio output decreases of at least one of said second speaker and said low-frequency output speaker based on said proportional fading, the processor decreases the cutoff frequency of the filter so that additional low frequency output of said signal associated with the decreased cutoff frequency is further electrically communicated to said first speaker's audio output so that the first speaker's audio output is increased.

* * * * *